United States Patent
Usui

(10) Patent No.: US 8,863,043 B1
(45) Date of Patent: Oct. 14, 2014

(54) INSPECTION DATA GENERATOR, INSPECTION DATA GENERATING METHOD AND PATTERN INSPECTING METHOD

(71) Applicant: Kabushiki Kaisha Toshiba, Minato-ku (JP)

(72) Inventor: Satoshi Usui, Nagoya (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 13/970,839

(22) Filed: Aug. 20, 2013

Related U.S. Application Data

(60) Provisional application No. 61/828,710, filed on May 30, 2013.

(51) Int. Cl.
*G06F 17/50* (2006.01)

(52) U.S. Cl.
CPC .................. G06F 17/5081 (2013.01)
USPC .................. 716/52; 716/51; 716/53; 716/54; 716/55; 716/56; 430/5; 430/30

(58) Field of Classification Search
CPC ............ G03F 7/70466; G03F 7/70633; G03F 7/70358; G03F 7/70516; G03F 1/84; G06F 17/50; G06F 17/5081
USPC ...................... 716/50–56; 430/5, 30
See application file for complete search history.

(56) References Cited

U.S. PATENT DOCUMENTS

| | | | |
|---|---|---|---|
| 6,855,997 B2 * | 2/2005 | Suwa | 430/5 |
| 7,906,253 B2 * | 3/2011 | Aton et al. | 430/5 |
| 8,072,601 B2 * | 12/2011 | Fukuhara et al. | 356/401 |
| 8,233,695 B2 | 7/2012 | Usui et al. | |
| 8,252,489 B2 * | 8/2012 | Su et al. | 430/5 |
| 8,397,182 B2 * | 3/2013 | Nagahara | 716/53 |
| 2005/0074678 A1 * | 4/2005 | Lin | 430/5 |

(Continued)

FOREIGN PATENT DOCUMENTS

| | | |
|---|---|---|
| JP | 2008-147584 | 6/2008 |
| JP | 2009-222627 | 10/2009 |

(Continued)

OTHER PUBLICATIONS

"Assessing Chip-Level Impact of Double Patterning Lithography", by Kwangok Jeong, Andrew B. Kahng, and Rasit O. Topaloglu, @2010 by IEEE.*

*Primary Examiner* — Nha Nguyen
(74) *Attorney, Agent, or Firm* — Oblon, Spivak, McClelland, Maier & Neustadt, L.L.P.

(57) ABSTRACT

An inspection data generator generates inspection data used to inspect a pattern transferred onto the same material layer using exposure processes. An input part of the generator receives first layout data for a mask used in a first exposure process and second layout data for a mask used in a second exposure process, and receives a measured value of a misalignment between a first transfer pattern actually transferred onto the material layer in the first exposure process and a second transfer pattern actually transferred onto the material layer in the second exposure process. A processor unit generates the inspection data by shifting the first layout data and the second layout data from each other by an amount corresponding to the measured value and then combining the first layout data with the second layout data. An output part outputs the inspection data to inspect the pattern transferred onto the material layer.

6 Claims, 7 Drawing Sheets

(56) References Cited

U.S. PATENT DOCUMENTS

| | | | |
|---|---|---|---|
| 2008/0089575 A1* | 4/2008 | Badger et al. | 382/144 |
| 2008/0144920 A1* | 6/2008 | Usui et al. | 382/144 |
| 2008/0307381 A1* | 12/2008 | Tritchkov et al. | 716/11 |
| 2009/0130570 A1* | 5/2009 | Zhang et al. | 430/5 |
| 2010/0021046 A1 | 1/2010 | Nagahama | |
| 2010/0074511 A1* | 3/2010 | Tamamushi et al. | 382/141 |
| 2011/0235895 A1* | 9/2011 | Kitamura et al. | 382/144 |
| 2012/0026316 A1 | 2/2012 | Nagahama | |
| 2012/0052422 A1* | 3/2012 | Lu et al. | 430/30 |
| 2012/0070067 A1* | 3/2012 | Fang et al. | 382/151 |
| 2012/0328181 A1* | 12/2012 | Kitamura et al. | 382/145 |
| 2013/0032712 A1* | 2/2013 | Shih et al. | 250/307 |
| 2013/0157178 A1* | 6/2013 | Tsai et al. | 430/5 |
| 2013/0198696 A1* | 8/2013 | Wang et al. | 716/51 |
| 2014/0036243 A1* | 2/2014 | Beyer et al. | 355/52 |

FOREIGN PATENT DOCUMENTS

| | | |
|---|---|---|
| JP | 2010-34138 | 2/2010 |
| JP | 2010-287762 | 12/2010 |
| JP | 4909729 | 1/2012 |
| JP | 2012-26969 | 2/2012 |

* cited by examiner

INSPECTION DATA GENERATOR, INSPECTION DATA GENERATING METHOD AND PATTERN INSPECTING METHOD

CROSS REFERENCE TO RELATED APPLICATIONS

This application is based upon and claims the benefit of priority from the prior U.S. Provisional Patent Application No. 61/828,710, filed on May 30, 2013, the entire contents of which are incorporated herein by reference.

FIELD

The embodiments of the present invention relate to an inspection data generator, an inspection data generating method and a pattern inspecting method.

BACKGROUND

In recent years, downscaling of semiconductor integrated circuits has been increasingly accelerated. Along with the downscaling, it becomes difficult to detect defective portions (Hotspots) on an integrated circuit pattern formed on a semiconductor substrate. Conventionally, a Die-to-Die inspection of comparing actually transferred patterns is mainly conducted for detection of Hotspots. However, along with the downscaling of semiconductor integrated circuits, it is highly likely that a Die-to-Database inspection of comparing an actually transferred pattern with design data becomes a mainstream inspection. In the Die-to-Database inspection, the actually transferred pattern is compared with the design data and Hotspots of the transferred pattern are detected at predetermined defect detection sensitivity. Therefore, inspection data based on which the comparison is performed at the time of inspecting the transferred pattern is important. However, the design data is not necessarily appropriate as the inspection data as it is, due to process fluctuations such as a misalignment in an exposure process. Therefore, it has been desired to provide appropriate data as the inspection data used in the Die-to-Database inspection.

DETAILED DESCRIPTION

Embodiments will now be explained with reference to the accompanying drawings. The present invention is not limited to the embodiments. In the embodiments, "an upper direction" or "a lower direction" refers to a relative direction when a direction of a surface of a semiconductor substrate on which semiconductor elements are provided is assumed as "an upper direction". Therefore, the term "upper direction" or "lower direction" occasionally differs from an upper direction or a lower direction based on a gravitational acceleration direction.

An inspection data generator according to the present embodiment generates inspection data used to inspect a pattern transferred onto the same material layer using a plurality of exposure processes. An input part of the generator receives first layout data for a mask used in a first exposure process among the plurality of exposure processes and second layout data for a mask used in a second exposure process among the plurality of exposure processes, and receives a measured value of a misalignment between a first transfer pattern actually transferred onto the material layer in the first exposure process and a second transfer pattern actually transferred onto the material layer in the second exposure process. An arithmetic processing unit of the generator generates the inspection data by shifting the first layout data and the second layout data from each other by an amount corresponding to the measured value and then combining the first layout data with the second layout data. An output part of the generator outputs the inspection data in order to inspect the pattern transferred onto the material layer.

Figure 1:
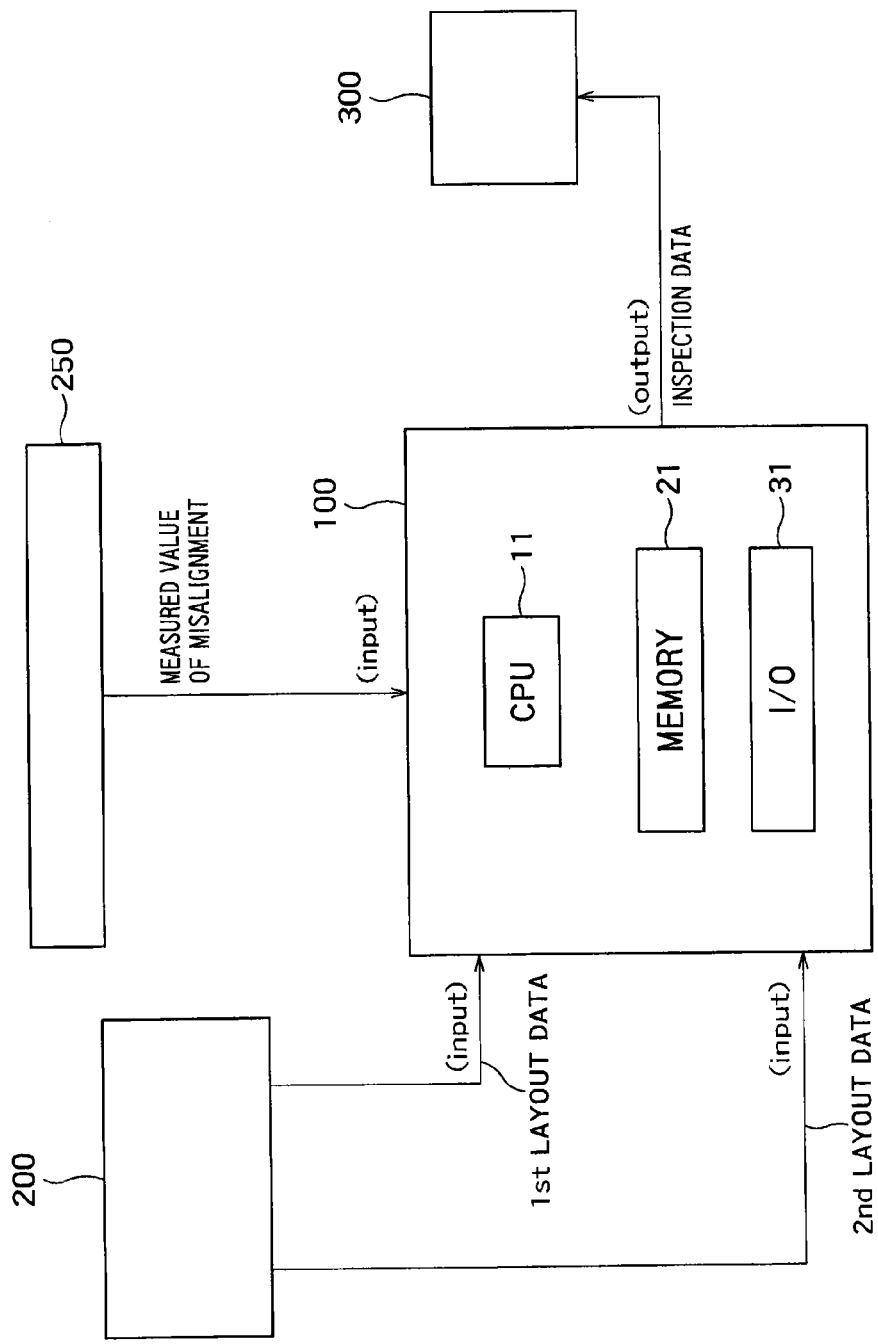
FIG. 1 is a block diagram showing an example of a configuration of an inspection data generator 100, a design device 200, a misalignment measurement device 250, and a pattern inspection device 300 according to the present embodiment.

FIG. 1 is a block diagram showing an example of a configuration of an inspection data generator 100, a design device 200, a misalignment measurement device 250, and a pattern inspection device 300 according to the present embodiment.

The design device 200 creates design data on an integrated circuit pattern to be transferred onto a material layer and/or, as described later, performs a pattern split process for splitting the design data into a first layout pattern and a second layout pattern. For example, a general-purpose PC (Personal Computer) can be used as the design device 200.

An exposure device (not shown) exposes a photoresist applied onto the material layer to light to transfer a desired layout pattern onto the material layer formed on a substrate. At this time, the exposure device irradiates the photoresist with exposure light via a photomask on which the desired layout pattern is drawn in advance. After exposure of the photoresist, the photoresist is developed, whereby the photoresist can be formed into the desired layout pattern. An etching device (not shown) etches the material layer using the patterned photoresist as a mask. The material layer can be thereby processed into the desired layout pattern. The material layer is processed by a series of processes using a lithographic technique and an etching technique described above. To process the material layer into the desired layout pattern using the lithographic technique and the etching technique is also referred to as "to transfer" the layout pattern.

In the present embodiment, a single layout pattern is transferred onto the same material layer using a plurality of exposure processes. That is, the single layout pattern is transferred onto the material layer by performing a series of processes using the lithographic technique and the etching technique on the same material layer repeatedly many times. For example, in a first exposure process, a photoresist having a first layout pattern is formed on the material layer and the material layer is etched using the photoresist as a mask. The first layout pattern is thereby transferred onto the material layer. Then, in a second exposure process, a photoresist having a second layout pattern is formed on the material layer and the material layer is processed using the photoresist as a mask. The second layout pattern is thereby also transferred onto the material layer. In this way, the single layout pattern that is a combination of the first and second layout patterns is transferred onto the material layer by transferring the first and second layout patterns onto the same material layer. Therefore, a highly-integrated and fine layout pattern can be transferred onto the material layer relatively easily by splitting the single layout pattern into a plurality of layout patterns.

The inspection data generator 100 generates inspection data to inspect a layout pattern actually transferred onto the same material layer (hereinafter, also "transfer pattern") using these exposure processes. The inspection data is data on a reference pattern based on which the transfer pattern is compared to detect defective portions (so-called "Hotspots") of the pattern actually transferred onto the material layer. The inspection data is generated by combining design data on a plurality of layout patterns (hereinafter, also "first layout data" and "second layout data") used in the respective exposure, processes. A transfer pattern corresponding to the first layout data is referred to as "first transfer pattern", and a transfer pattern corresponding to the second layout data is referred to as "second transfer pattern."

The inspection data generator 100 includes a CPU (Central Processing Unit) 11, a memory 21, and an input/output circuit 31 to generate the inspection data. The CPU 11 controls respective constituent elements of the inspection data generator 100 and executes computation necessary to generate the inspection data. The memory 21 can have a program necessary to generate the inspection data, the first and second layout patterns input via the input/output circuit 31, the inspection data to be output via the input/output circuit 31, and the like, stored therein.

The input/output circuit 31 functions as an input part that receives the first and second layout patterns from the design device 200, and also functions as an output part that outputs the inspection data to the pattern inspection device 300. Furthermore, the input/output circuit 31 receives a measured value of a misalignment between the first transfer pattern actually transferred onto the material layer in the first exposure process and the second transfer pattern actually transferred onto the material layer in the second exposure process.

The misalignment measurement device 250 measures a misalignment amount (a misalignment distance) between the first transfer pattern and the second transfer pattern. The measured value of the misalignment is input to the first input/output circuit 31 from the misalignment measurement device 250.

Generally, when a pattern is transferred onto the same material layer using a plurality of exposure processes, a problem of misalignments among patterns in the respective exposure processes occurs. For example, when the first and second transfer patterns actually transferred onto the material layer are relatively largely misaligned to each other, the actually transferred pattern differs from the inspection data in many portions. In this case, it is difficult to discern whether those different portions are false defects resulting from the misalignment between the first and second transfer patterns or defective portions (so-called "Hotspots") resulting from the design pattern or processes. Therefore, it is difficult to detect Hotspots.

The inspection data generator 100 according to the present embodiment generates the inspection data in light of the misalignment amount between the first and second transfer patterns used in the respective exposure processes as described later. That is, the CPU 11 of the inspection data generator 100 shifts the first and second layout patterns from each other by an amount corresponding to the measured value of the misalignment between the first and second transfer patterns and then combines the first and second layout patterns. The inspection data generator 100 thereby generates the inspection data. This facilitates detecting Hotspots.

The measured value of the misalignment includes a measured value of a misalignment in a parallel direction in an upper surface of the material layer, a measured value of a misalignment in a rotational direction, or a measured value of a magnification-related misalignment.

The pattern inspection device 300 receives the inspection data from the inspection data generator 100. The pattern inspection device 300 houses a substrate and images the actually transferred pattern on the material layer. The pattern inspection device 300 compares the actually transferred pattern with the inspection data, thereby inspecting the layout pattern actually transferred onto the material layer. The pattern inspection device 300 detects Hotspots by conducting this inspection.

Figure 2:
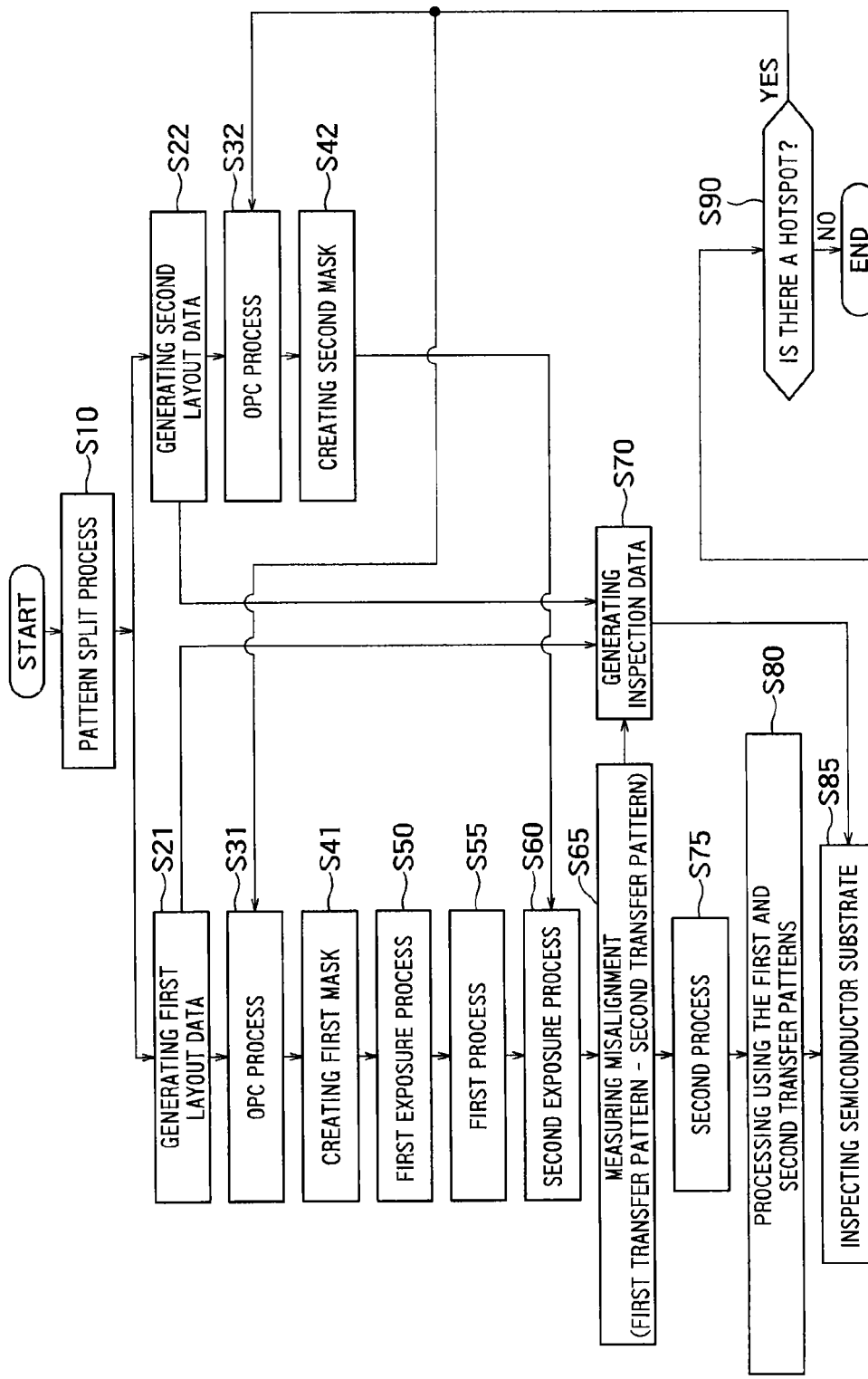
FIG. 2 is a flowchart showing an inspection data generating method according to the present embodiment.

FIG. 2 is a flowchart showing an inspection data generating method according to the present embodiment. First, the design device 200 splits the design data on the integrated circuit pattern to be transferred onto the material layer into the first layout pattern and the second layout pattern. This process is referred to as "pattern split process" (S10). The first layout data and the second layout data used to create a first mask and a second mask used in exposure processes, respectively, are thereby generated (S21 and S22).

Figure 3C:
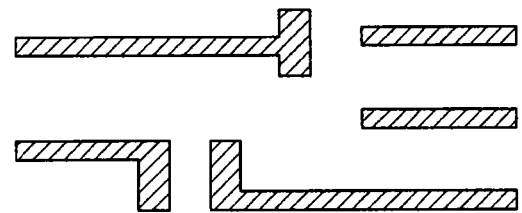
FIGS. 3A to 3C are layout views showing an example of the design data on the integrated circuit, the first layout data, and the second layout data, respectively.
Figure 3B:
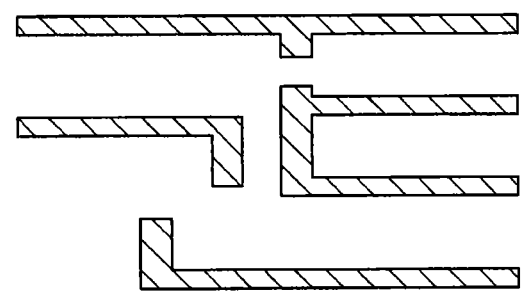
Figure 3A:
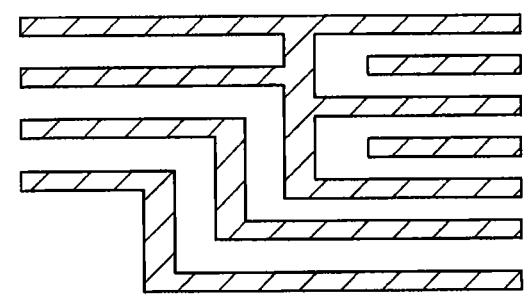

FIGS. 3A to 3C are layout views showing an example of the design data on the integrated circuit, the first layout data, and the second layout data, respectively. In the pattern split process, the original design data shown in FIG. 3A is split into the first layout data shown in FIG. 3B and the second layout data shown in FIG. 3C.

The first layout data and the second layout data generated at Steps S21 and S22, respectively, are transmitted to the inspection data generator 100 and used to generate the inspection data.

Then, an OPC (Optical Proximity Correction) process is performed on the first and second layout data (S31 and S32). The OPC process is a process for correcting the first and second layout data in light of an optical proximity effect. The actual transferred pattern can be thereby approximated to the original design layout pattern. Steps S10 to S32 can be performed by the general-purpose PC such as the design device 200. Needless to mention, Steps S10 to S32 can be alternatively performed by a CPU of another device such as a mask creation device (not shown).

Using the first and second layout data, the first and second masks are then created (S41 and S42). As a result, the first layout pattern is drawn on the first mask used in the first exposure process among the exposure processes based on the first layout data. The second layout pattern is drawn on the second mask used in the second exposure process among the exposure processes based on the second layout data. Steps S41 and S42 are performed by the mask creation device. A commonly-known mask creation device can be used therefor. Therefore, detailed explanations thereof will be omitted.

FIGS. 4A to 4E are cross-sectional views showing processes for processing the material layer (a hard mask HM or an insulating film 20, for example) using the first and second exposure processes. The inspection data generating method is further explained hereinafter with reference to FIGS. 2 and 4A to 4E. In the explanations with reference to FIGS. 4A to 4E, the first and second masks are denoted by reference characters PM1 and PM2, respectively, for the sake of convenience. In the present embodiment, for example, the insulating film 20 is deposited above a semiconductor substrate 10. The material of the hard mask HM is deposited on the insulating film 20. A photoresist PR1 is applied onto the hard mask HM.

Figure 4A:
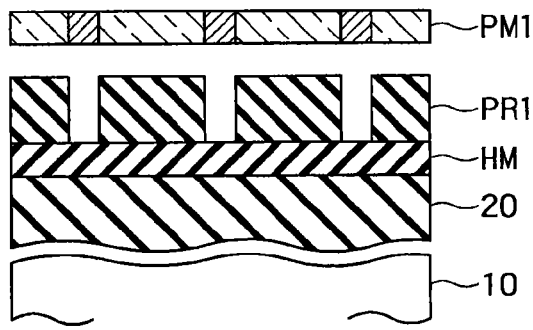
FIGS. 4A to 4E are cross-sectional views showing processes for processing the material layer using the first and second exposure processes.

As shown at Step S50 in FIG. 2, the exposure device exposes the photoresist PR1 applied onto the hard mask HM that serves as the material layer to the light using the first mask PM1 (S50: the first exposure process). By developing the photoresist PR1, the photoresist PR1 is formed into the first transfer pattern as shown in FIG. 4A.

Figure 4B:
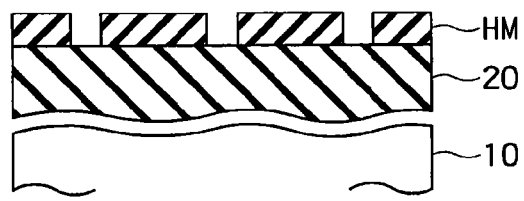

Using the photoresist PR1 as a mask, the etching device then etches the hard mask HM (S55: a first processing process). As shown in FIG. 4B, the first transfer pattern is thereby transferred onto the hard mask HM.

Figure 4C:
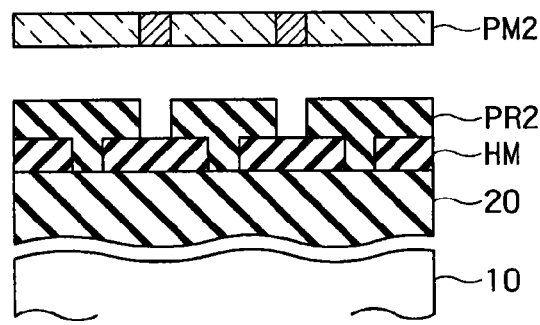

After removing the photoresist PR1 on the hard mask HM, another photoresist PR2 is applied onto the hard mask HM. Using the second mask PM2, the exposure device then exposes the photoresist PR2 applied onto the hard mask HM to the light (S60: the second exposure process). By developing the photoresist PR2, the photoresist PR2 is formed into the second transfer pattern as shown in FIG. 4C.

The misalignment measurement device 250 then measures a misalignment between the first transfer pattern transferred onto the material layer (the hard mask HM) and the second transfer pattern of the photoresist PR2 (S65). The measured value of the misalignment measured at Step S65 is transmitted to the inspection data generator 100 and used to generate the inspection data.

The misalignment suffices to be one of or a combination of, for example, the misalignment in the parallel direction in the plane of the material layer, the misalignment in the rotational direction, and the magnification-related misalignment. The misalignment is explained with reference to FIGS. 5 and 6A to 6C. In the explanations with reference to FIGS. 5 and 6A to 6C, the first and second transfer patterns are denoted by reference characters TP1 and TP2, respectively, and the material layer is denoted by reference character ML for the sake of convenience.

Figure 5:
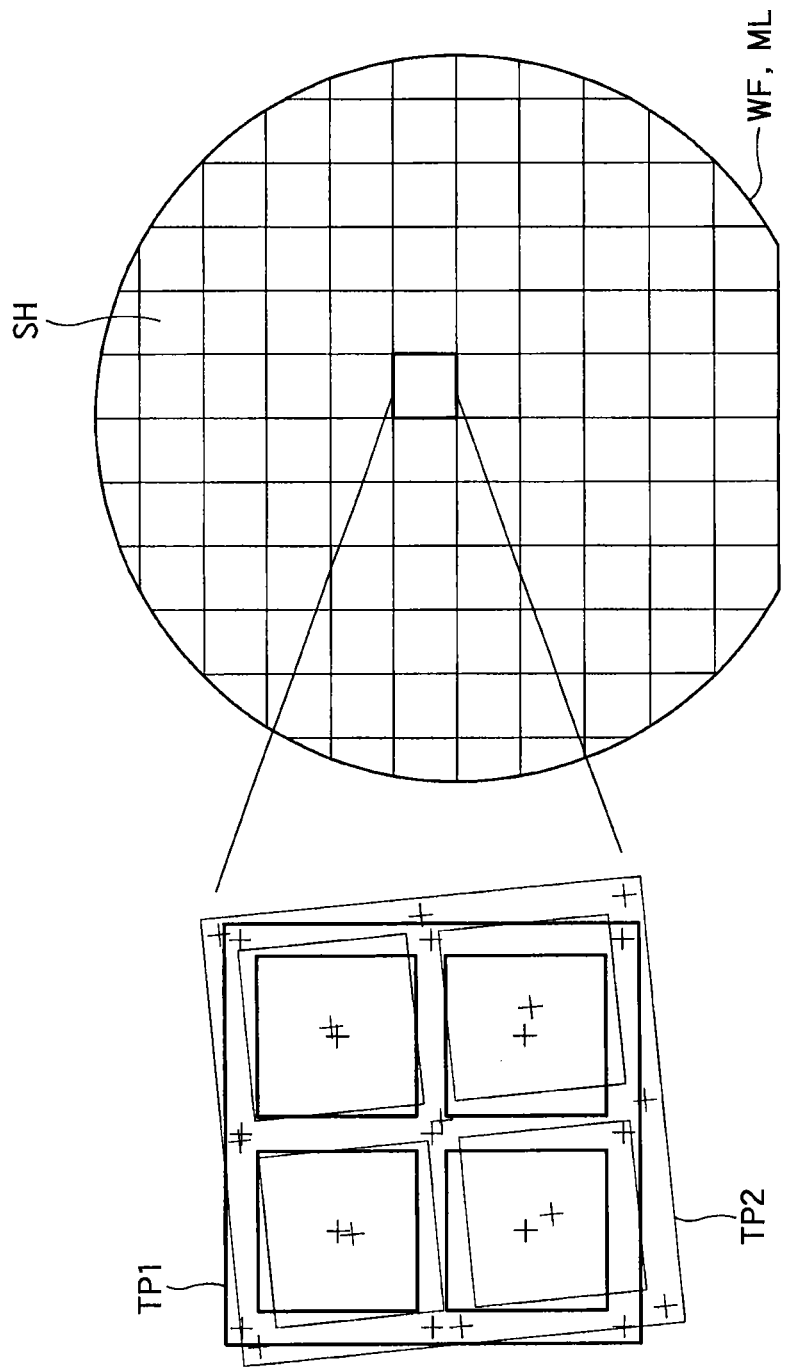
FIG. 5 shows exposure shots SH in the first and second exposure processes and schematic layout patterns of the first and second transfer patterns TP1 and TP2 at a certain exposure shot SH.
Figure 6A:
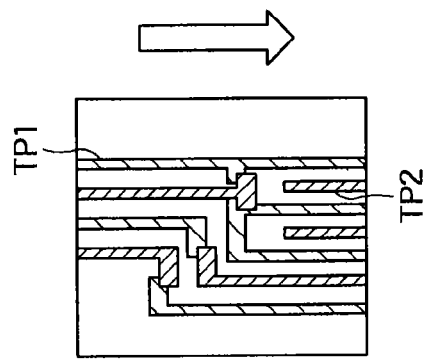
FIGS. 6A to 6C are explanatory diagrams showing misalignments between the first transfer pattern TP1 and the second transfer pattern TP2.
Figure 6B:
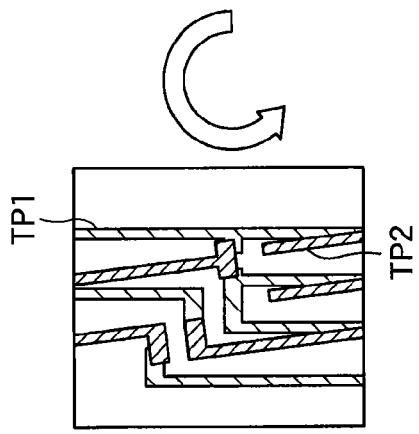
Figure 6C:
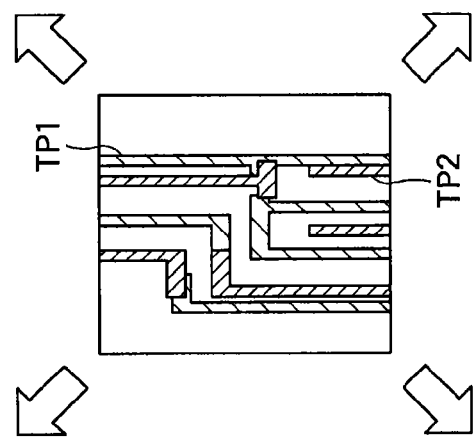

FIG. 5 shows exposure shots SH in the first and second exposure processes and schematic layout patterns of the first and second transfer patterns TP1 and TP2 at a certain exposure shot SH. FIGS. 6A to 6C are explanatory diagrams showing misalignments between the first transfer pattern TP1 and the second transfer pattern TP2. As shown in FIG. 5, the exposure device exposes the photoresist transferred onto the material layer ML to the light for every exposure shot SH. Furthermore, as shown in FIG. 5, the misalignment between the first transfer pattern TP1 transferred using the first exposure process and the second transfer pattern TP2 transferred using the second exposure process may occur at each shot SH. For example, alignment marks "+" on the second transfer pattern TP2 shown in FIG. 5 are not superimposed on the corresponding alignment marks "+" on the first transfer pattern TP1 and shift therefrom, respectively. A distance (or an angle, a magnification, or the like) between each of the alignment marks "+" on the first transfer pattern TP1 and each of the corresponding alignment marks "+" on the second transfer pattern TP2 signifies the misalignment amount.

FIG. 6A shows a misalignment in the parallel direction in the plane of the material layer. FIG. 6B shows a misalignment in the rotational direction in the plane of the material layer. FIG. 6C shows a magnification-related misalignment. However, the misalignments between the first transfer pattern TP1 and the second transfer pattern TP2 are not limited to those shown in FIGS. 6A to 6C.

When receiving the measured value of the misalignment measured at Step S65 in FIG. 2, the inspection data generator 100 generates the inspection data using the first layout data, the second layout data, and the measured value of the misalignment (S70). The inspection data generator 100 shifts the first and second layout data from each other by an amount corresponding to the measured value of the misalignment between the first transfer pattern TP1 and the second transfer pattern TP2, and then combines the first layout pattern with the second layout pattern. More specifically, the inspection data generator 100 shifts the first layout data and the second layout data from each other similarly to the misalignment between the first transfer pattern TP1 and the second transfer pattern TP2, and then combines the first layout pattern with the second layout pattern.

For example, as shown in FIG. 6A, when the second transfer pattern TP2 shifts from the first transfer pattern TP1 in the parallel direction in the plane of the material layer, the inspection data generator 100 shifts the second layout data in the parallel direction relative to the first layout data by a distance (an interval) equal to the measured value of the misalignment between the first transfer pattern TP1 and the second transfer pattern TP2, and then combines the first and second layout data. As shown in FIG. 6B, when the second transfer pattern TP2 shifts from the first transfer pattern TP1 in the rotational direction in the plane of the material layer, the inspection data generator 100 rotates the second layout data relative to the first layout data by an angle equal to the measured value of the misalignment between the first transfer pattern TP1 and the second transfer pattern TP2, and then combines the first and second layout data. As shown in FIG. 6C, when the second transfer pattern TP2 differs from the first transfer pattern TP1 in magnifications, the inspection data generator 100 enlarges or reduces the second layout data relative to the first layout data by a magnification equal to the measured value of the misalignment between the first transfer pattern TP1 and the second transfer pattern TP2, and then combines the first and second layout data. In this way, the inspection data generator 100 generates the inspection data. The inspection data generator 100 transmits the inspection data to the pattern inspection device 300.

Figure 4D:
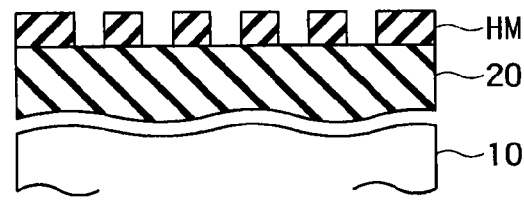

Using the photoresist PR2 as a mask, the etching device then etches the hard mask HM (S75: a second processing process). As shown in FIG. 4D, the second transfer pattern is thereby transferred onto the hard mask HM.

Figure 4E:
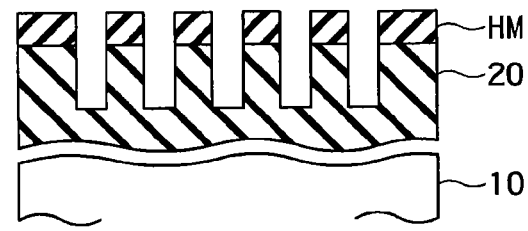

Using the hard mask HM processed into the first and second patterns as a mask, the etching device then processes the insulating film 20 by etching (S80). As shown in FIG. 4E, the insulating film 20 is thereby processed into the layout pattern that is the combination of the first and second transfer patterns.

The pattern inspection device 300 then inspects the transfer pattern formed on the insulating film 20 on the semiconductor substrate 10 (S85). In this case, the pattern inspection device 300 compares the inspection data received from the inspection data generator 100 with the actually transferred pattern. The inspection data is generated (corrected) in light of the misalignment between the first transfer pattern and the second transfer pattern similarly to the actually transferred pattern. In other words, different portions (false defects) resulting from the misalignment between the first transfer pattern and the second transfer pattern are removed in advance. The pattern inspection device 300 can thereby detect Hotspots easily by comparing the inspection data with the actually transferred pattern.

When a Hotspot is detected (YES at S90), the OPC process is performed again at Steps S31 and S32 to dissolve the Hotspot. Alternatively, the design data can be changed. Steps S41 to S90 are then repeated again.

When no Hotspot is detected or the Hotspot is smaller than a predetermined value (NO at S90), the pattern inspection device 300 ends a pattern inspection process.

In a process of mass-producing semiconductor chips, a metal material is filled in trenches formed in the insulating film 20 by a damascene method after the process shown in FIG. 4E. A metal wiring pattern is thereby formed in the insulating film 20. The inspection data generator, the inspection data generating method, and the pattern inspecting method according to the present embodiment are also applicable to processes for forming patterns other than the wiring pattern.

Figure 7:
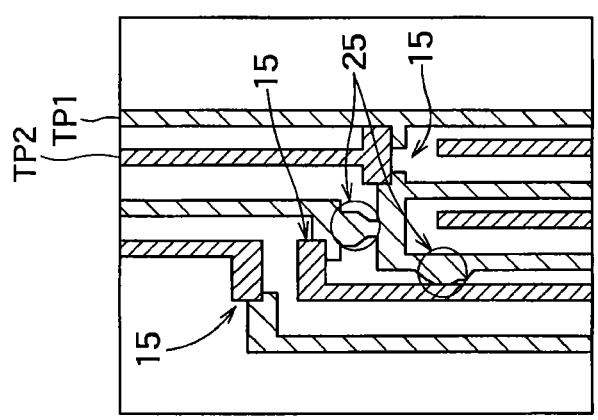
FIG. 7 is a schematic plan view showing false defects 15 resulting from the misalignment between the first transfer pattern TP1 and the second transfer pattern TP2, and Hotspots 25.

FIG. 7 is a schematic plan view showing false defects 15 resulting from the misalignment between the first transfer pattern TP1 and the second transfer pattern TP2, and Hotspots 25. The false defects 15 are reflected in the inspection data, so that the false defects 15 are not detected as defects. On the other hand, the Hotspots 25 are defects resulting from the design pattern or the processes, so that the Hotspots 25 are not included in the inspection data. Therefore, the pattern inspection device 300 can easily identify each Hotspot 25 by comparing the actually transferred pattern with the inspection data.

As described above, the inspection data generator 100 according to the present embodiment generates the inspection data in light of the misalignment between the first transfer pattern and the second transfer pattern. That is, the misalignment between the first transfer pattern and the second transfer pattern is reflected in the inspection data in advance. The inspection data generator 100 according to the present embodiment can thereby provide highly-accurate inspection data for the Die-to-Database inspection. The pattern inspection device 300 can easily identify Hotspots by comparing such inspection data with the actually transferred pattern. As a result, it is possible to perform an appropriate OPC process or appropriately change the design data in a mask creation phase.

Furthermore, as shown in FIG. 5, in the present embodiment, the pattern inspection is conducted for every exposure shot SH. Therefore, the inspection data is generated for each of exposure shots SH in exposure processes. With this configuration, the inspection data generator 100 can generate appropriate inspection data corresponding to each exposure shot SH even if the misalignment between the first transfer pattern and the second transfer pattern differs among the exposure shots SH.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A pattern inspecting method for inspecting a pattern transferred onto a same material layer using a plurality of exposure processes, the pattern inspecting method comprising:
    generating first layout data for a first mask used in a first exposure process among the plurality of exposure processes, and generating second layout data for a second mask used in a second exposure process among the plurality of exposure processes;
    creating the first mask according to the first layout data, and creating the second mask according to the second layout data;
    transferring a first transfer pattern onto the material layer using the first exposure process;
    measuring a misalignment between the first transfer pattern and a second transfer pattern when transferring the second transfer pattern onto the material layer using the second exposure process;
    generating inspection data by shifting the first layout data and the second layout data from each other by an amount corresponding to the measured value of the misalignment and then combining the first layout data with the second layout data; and
    inspecting the pattern transferred onto the material layer by comparing the pattern transferred onto the material layer with the inspection data, after transferring the second transfer pattern onto the material layer.

2. The method of claim 1, wherein the measured value of the misalignment includes a measured value of a misalignment in a parallel direction in a plane of the material layer, a measured value of a misalignment in a rotational direction, or a measured value of a magnification-related misalignment.

3. The method of claim 2, wherein the inspection data is generated by relatively shifting the first layout data and the second layout data from each other by a distance equal to the measured value and then combining the first layout data with the second layout data, when the misalignment is the misalignment in the parallel direction in the plane of the material layer.

4. The method of claim 2, wherein the inspection data is generated by relatively rotating the first layout data and the second layout data from each other by an angle equal to the measured value and then combining the first layout data with the second layout data, when the misalignment is the misalignment in the rotational direction in the plane of the material layer.

5. The method of claim 2, wherein the inspection data is generated by relatively scaling the first layout data and the second layout data from each other by a magnification equal to the measured value and then combining the first layout data with the second layout data, when the misalignment is the misalignment in the magnification-related misalignment in the plane of the material layer.

6. The method of claim 1, wherein the inspection data are generated for each of exposure shots in the exposure processes.

* * * * *